United States Patent
Padilla et al.

(10) Patent No.: US 9,425,110 B1
(45) Date of Patent: Aug. 23, 2016

(54) YIELD ENHANCING VERTICAL REDUNDANCY METHOD FOR 3D WAFER LEVEL PACKAGED (WLP) INTEGRATED CIRCUIT SYSTEMS

(71) Applicant: NORTHROP GRUMMAN SYSTEMS CORPORATION, Falls Church, VA (US)

(72) Inventors: Jose G. Padilla, South Gate, CA (US); Philip W. Hon, Hawthorne, CA (US); Shih-En Shih, Torrance, CA (US); Roger S. Tsai, Torrance, CA (US); Xianglin Zeng, Monterey Park, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/837,718

(22) Filed: Aug. 27, 2015

(51) Int. Cl.
| | |
|---|---|
| *H01L 21/66* | (2006.01) |
| *H01L 21/768* | (2006.01) |
| *H01L 25/065* | (2006.01) |
| *H01L 25/00* | (2006.01) |
| *H01L 23/66* | (2006.01) |

(52) U.S. Cl.
CPC ............... *H01L 22/30* (2013.01); *H01L 22/22* (2013.01); *H01L 22/32* (2013.01); *H01L 23/66* (2013.01); *H01L 25/0657* (2013.01); *H01L 25/50* (2013.01); *H01L 2223/6616* (2013.01); *H01L 2223/6683* (2013.01); *H01L 2225/06555* (2013.01); *H01L 2225/06596* (2013.01)

(58) Field of Classification Search
CPC ............................... H01L 22/22; H01L 22/32
See application file for complete search history.

(56) References Cited

U.S. PATENT DOCUMENTS

| | | | |
|---|---|---|---|
| 4,621,201 | A | 11/1986 | Amdahl et al. |
| 5,298,433 | A | 3/1994 | Furuyama |

(Continued)

OTHER PUBLICATIONS

Pavlidis, Vasilis F. "Interconnect-Based Design Methodologies for Three-Dimensional Integrated Circuits" Proceedings of the IEEE vol. 97, No. 1, Jan. 2009, pp. 123-140.

(Continued)

*Primary Examiner* — Evan Pert
(74) *Attorney, Agent, or Firm* — John A. Miller; Miller IP Group, PLC

(57) ABSTRACT

A three-dimensional wafer level packaged (WLP) integrated circuit that includes a pair of opposing circuit cells fabricated on separate wafers that have been bonded together to provide vertical circuit redundancy. The integrated circuits on each of the separate wafers are performance tested prior to the wafers being bonded together so as to designate good performing circuits as active circuit cells and poor performing circuits as inactive circuit cells. The inactive circuit cell for a particular pair of integrated circuits is metalized with a short circuiting metal layer to make it inoperable. The WLP integrated circuit implements a yield-enhancing circuit redundancy scheme on spatially uncorrelated wafers that avoids wasting valuable wafer x-y planar area, which provides cost savings as a result of more wafer area being available for distinct circuits on each wafer rather than sacrificed for traditional side-by-side redundant copies of circuits.

19 Claims, 4 Drawing Sheets

(56) References Cited

U.S. PATENT DOCUMENTS

| | | | |
|---|---|---|---|
| 5,504,369 A * | 4/1996 | Dasse | G01R 31/2884 257/48 |
| 5,898,186 A * | 4/1999 | Farnworth | G01R 31/2841 257/203 |
| 5,986,950 A | 11/1999 | Joseph | |
| 6,448,664 B1 * | 9/2002 | Tay | G01R 1/0408 257/48 |
| 6,707,065 B2 * | 3/2004 | Fenner | G01R 31/2831 257/48 |
| 6,762,076 B2 | 7/2004 | Kim et al. | |
| 6,940,093 B2 * | 9/2005 | Eldridge | G01R 1/07307 257/48 |
| 7,037,804 B2 | 5/2006 | Kellar et al. | |
| 7,157,787 B2 | 1/2007 | Kim et al. | |
| 7,170,183 B1 | 1/2007 | Kim et al. | |
| 7,374,972 B2 | 5/2008 | Kwon et al. | |
| 7,491,581 B2 | 2/2009 | DCamp et al. | |
| 7,545,689 B2 | 6/2009 | Ilkbahar et al. | |
| 7,570,129 B2 | 8/2009 | Kintis et al. | |
| 8,039,302 B2 | 10/2011 | Tay et al. | |
| 8,106,488 B2 | 1/2012 | Chua et al. | |
| 2012/0001326 A1 | 1/2012 | Tay et al. | |
| 2014/0264945 A1 | 9/2014 | Yap et al. | |

OTHER PUBLICATIONS

Lu, Jian-Qiang, "3-D Hyperintegration and Packaging TEchnologies for Micro-Nano Systems" Proceedings of the IEEE vol. 97, No. 1, Jan. 2009, pp. 18-30.

Koester, S. J. et al. "Wafer-Level 3D Integration Technology" IBM J. Res. & Dev. vol. 52, No. 6, Nov. 2008, pp. 583-597.

Pavlidis, Vasilis F. et al. "3-D Topologies for Networks-on-Chip" IEEE Transactions on very large scale integration (VLSI) systems, vol. 15, No. 10, Oct. 2007, pp. 1081-1090.

Tsai, R. et al. "Multilayer W-Band Transmit Elements for Scalable Millimeter-Wave Arrays" IEEE, 2007, 3 pgs.

Padilla, Jose G. et al. "A W-Band GCPW SPDT GaAs PIN Switch in Wafer Level Packaged Phased Array Systems" 4 pgs.

Shih, S. E. "A W-Band InP HEMT Low Noise Amplifier in Wafer Level Packaging Phased Array Systems" 3 pgs.

Pavlidis, Vasilis F. et al. "Physical Design Issues in 3-D Integrated Technologies" 21 pgs.

* cited by examiner

YIELD ENHANCING VERTICAL REDUNDANCY METHOD FOR 3D WAFER LEVEL PACKAGED (WLP) INTEGRATED CIRCUIT SYSTEMS

GOVERNMENT CONTRACT

The U.S. Government may have a paid-up license in this invention and the right in limited circumstances to require the patent owner to license others on reasonable terms as provided for by the terms of Contract No. FA8650-06-C-7600 awarded by United States Air Force/Air Force Material Command.

BACKGROUND

1. Field

This invention relates generally to a three-dimensional wafer level packaged integrated circuit and, more particularly, to a three-dimensional wafer level packaged integrated circuit that includes a pair of opposing circuit cells fabricated on separate wafers that have been bonded together, where one of the circuit cells is designated as an active cell and the other circuit cell is designated as an inactive cell to provide circuit yield enhancement through vertical circuit redundancy on spatially uncorrelated wafers that avoids wasting valuable wafer x-y planar area so as to provide cost savings as a result of wafer area being available for distinct circuits on each wafer rather than sacrificed for traditional side-by-side redundant copies of circuits.

2. Discussion

It is known in the art to provide three-dimensional (3D) wafer-level packaging (WLP) of integrated circuits, such as monolithic micro-wave integrated circuits (MMIC), formed on electrically insulating or semi-insulating substrate wafers. In one wafer-level packaging design, a secondary (cover) wafer is mounted to a primary wafer using bonding rings or fences around the perimeter of each individual circuit so as to provide hermetically sealed cavities in which the integrated circuits are provided. Typically, many active and passive integrated circuits are fabricated on the primary wafer, whereas the secondary wafer serves as a passive substrate to form the WLP cover. The bonded pair of wafers are then diced between the bonding ring perimeters to singulate the individually packaged integrated circuits.

During fabrication of integrated circuits on a common substrate wafer, each of the circuits is tested at some point during the fabrication process by applying suitable electric signals to the circuit through testing probes or the like so as to determine which of the circuits properly operates for a particular application. The testing procedure typically determines that a certain percentage of the integrated circuits are inoperable and as such cannot be used and are ultimately discarded.

It is known in the art to provide horizontal (planar) redundancy when fabricating integrated circuits, where multiple identical circuits are horizontally configured and fabricated on the same substrate wafer. These known redundant circuit fabrication techniques for traditional planar circuits typically involve selectable monolithically processed and adjacently placed copies of the circuit on the same wafer. However, such a redundancy fabrication technique limits the number of unique integrated circuits that can be provided on a single wafer, thus reducing the yield of any particular circuit on such wafer and ultimately increasing cost. In addition, it is known in the art that planar monolithically processed integrated circuits on a common substrate are significantly spatially correlated to each other. In other words, typical fabrication processes result in localized wafer area defects such that if one circuit fails, then the probability of an adjacently processed circuit also failing increases; such that they become less effective as redundant backup circuits.

DETAILED DESCRIPTION OF THE EMBODIMENTS

The following discussion of the embodiments of the invention directed to a system and method for providing three-dimensional vertically redundant wafer level packaging for integrated circuits is merely exemplary in nature, and is in no way intended to limit the invention or its applications or uses.

Figure 1:
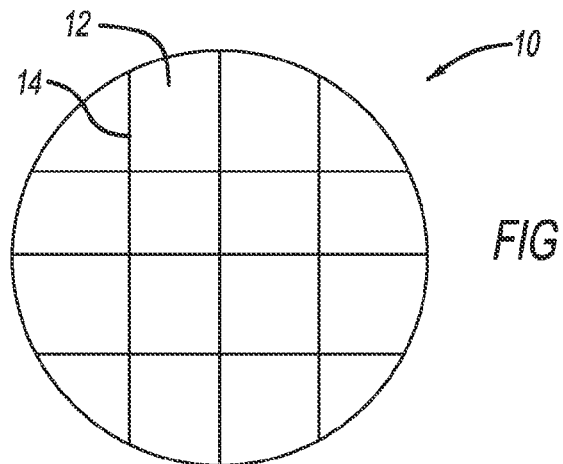
FIG. 1 is a top view representation of an integrated circuit wafer including a plurality of fields.
Figure 2:
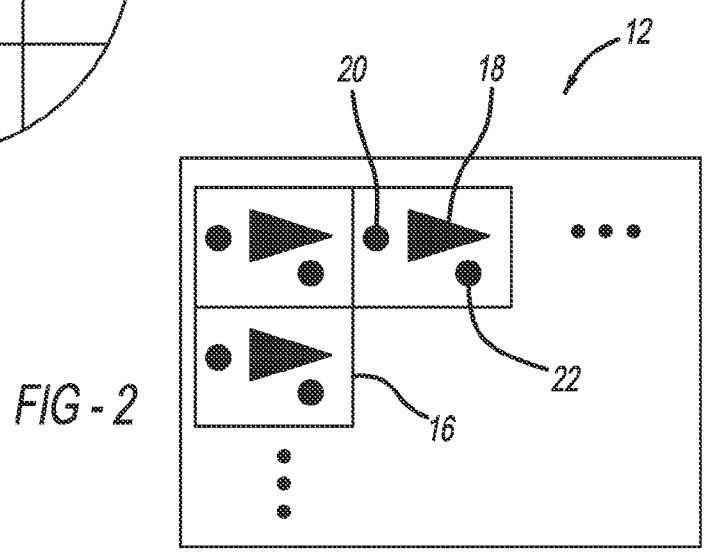
FIG. 2 is a top view of one of the fields in the wafer shown in FIG. 1 including a plurality of integrated circuit cells.

FIG. 1 is a top view of an integrated circuit wafer 10 separated into a number of fields 12 by lines 14. FIG. 2 is a top view of one of the fields 12 showing a number of integrated circuit cells 16 fabricated on the wafer 10 by known integrated circuit fabrication techniques, and where any particular group of the fields 12 on the wafer 10 may include the same circuit cells or different circuit cells 16. Each of the circuit cells 16 includes a number of circuit components, such as resistors, transistors, diodes, etc., represented generally by circuit component 18, an RF input/output port 20 and a DC bias port 22. The fields 12 are patterned and configured on the wafer 10 to provide an optimum configuration and orientation of the various circuit cells 16 so as to increase the number of the circuit cells 16 on the wafer 10. The integrated circuit fabrication processes as discussed herein are intended to include any suitable fabrication technique for any suitable integrated circuit, and employing any suitable semiconductor substrate material, such as Silicon (Si), Gallium Nitride (GaN), Gallium Arsenide (GaAs), Germanium (Ge), Indium Phosphide (InP), etc., and accompanying monolithic technologies for forming both the active and passive components of the integrated circuits.

As will be discussed in detail below, the present invention proposes a three-dimensional wafer level packaging fabrication process that provides vertical redundancy of the circuit cells 16 in a single wafer level package (WLP), where one of the circuit cells 16 is designated as an active circuit that performs the particular intended operation of the integrated circuit, and the other circuit cell 16 is designated as an inactive circuit that is made inoperable. The circuit redundancy process as described provides a single redundant copy of the circuit cell 16 on a separately processed and identically mirrored wafer, which when sorted and assembled with another non-mirrored wafer as a sandwiched wafer pair achieves vertically integrated redundancy of the circuit that requires no extra horizontal x-y planar wafer area, and as such decouples the spatial correlation between the redundant circuit cells 16. Further, face-to-face circuit architecture is employed as a technique of implementation so that both the active and inactive circuit cells 16 are mirror images of each other and are therefore a single design. The process for sorting and selecting the active and inactive circuit cells is performed before the wafer pair is bonded so that no additional selection circuitry is necessary. The process thus implements a yield-enhancing circuit redundancy scheme on spatially uncorrelated wafers that avoids wasting valuable wafer x-y planar area, which provides cost savings as a result of more wafer area being available for unique circuits on each wafer rather than sacrificed for traditional side-by-side redundant copies of circuits.

Figure 3:
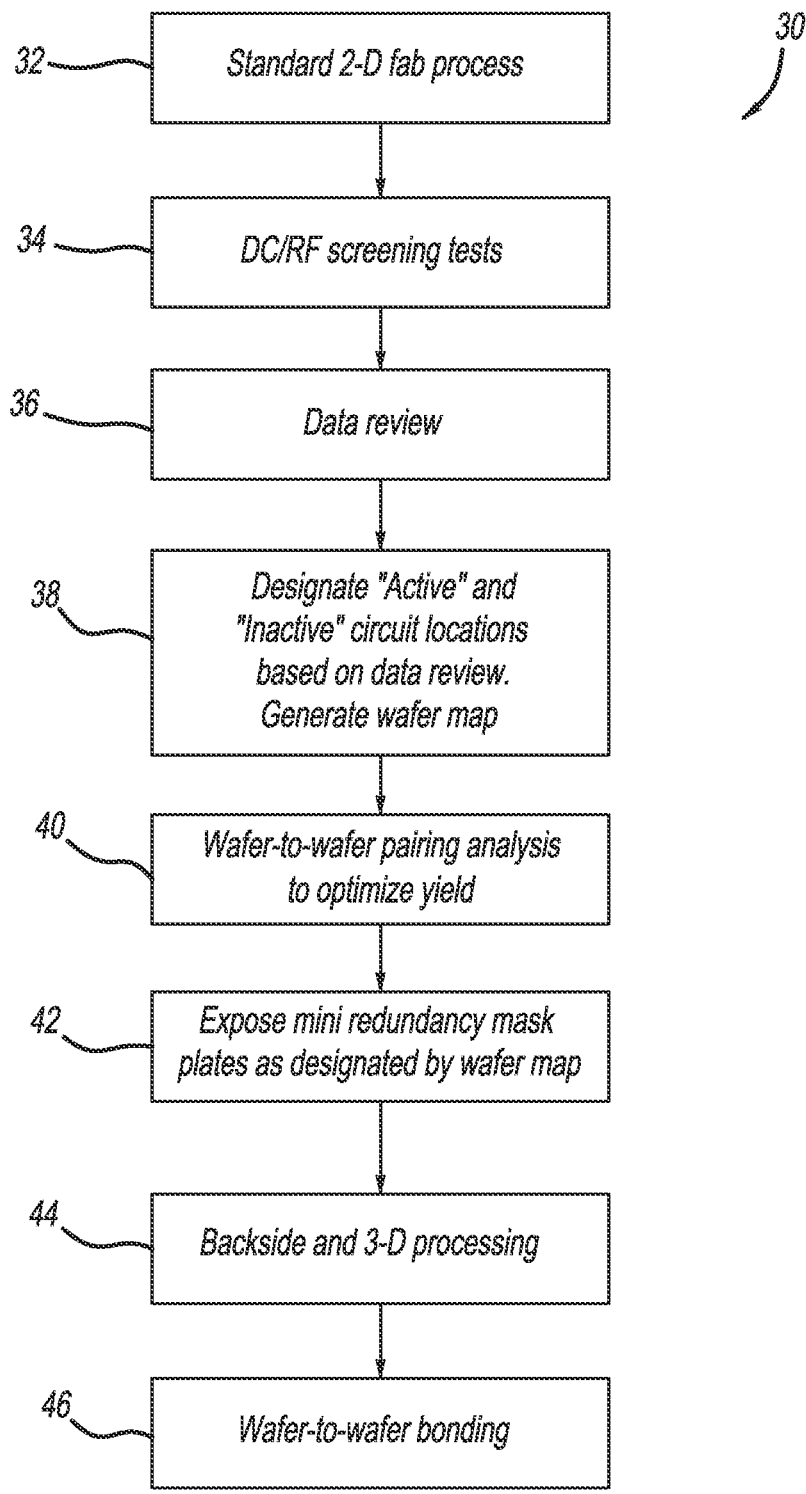
FIG. 3 is a flow diagram showing a process for providing vertical integrated circuit redundancy.

FIG. 3 is a flow diagram 30 showing a process for fabricating three-dimensional integrated circuit chips providing vertical redundancy as discussed above. At box 32, a plurality of primary and mirrored wafers are fabricated, ideally in equal numbers, such as one or more of the wafers 10, using well known standard two-dimensional semiconductor fabrication processes to provide a set of primary and mirrored wafers having identical fields 12 each having identical circuit cells 16. Once the integrated circuit cells 16 are fabricated on the plurality of wafers, then each wafer goes through a testing and screening process at box 34 to identify the performance characteristics of each of the circuit cells 16 to determine which of the circuit cells 16 will operate properly and which will not operate as intended. The testing and screening procedure can be any suitable technique, such as in-circuit measurement of active devices, such as transistors, diodes, etc., DC and RF characteristics, DC and RF measurements of strategically placed probeable sample devices around the circuit, or any combination thereof.

Figure 4:
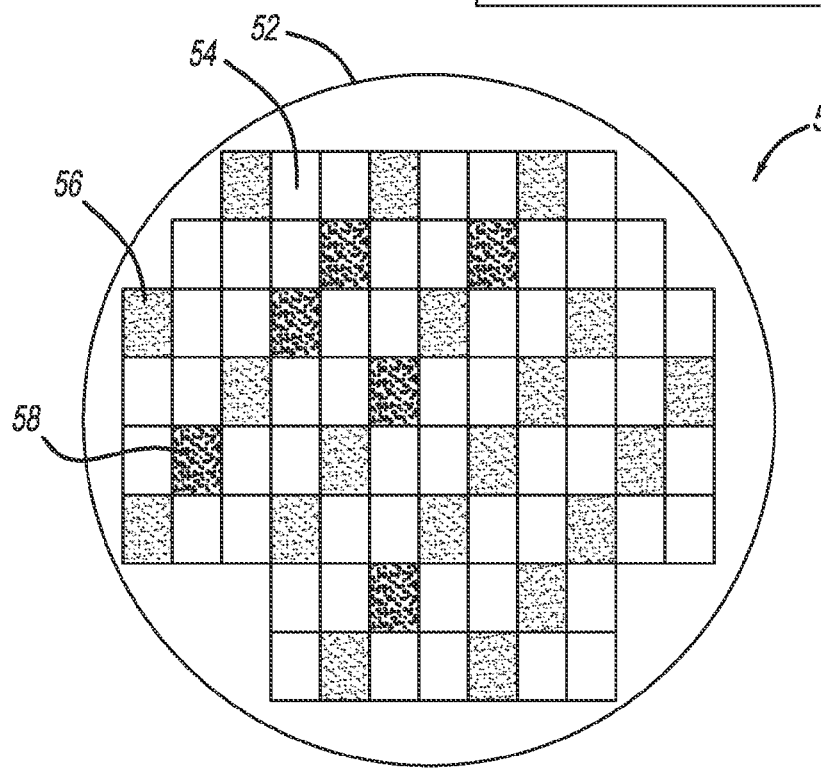
FIG. 4 is wafer map showing active and inactive circuit cells.

The performance data from the testing procedure of the circuit cells 16 is then reviewed at box 36 and a wafer map is generated at box 38 for each of the wafers that identifies whether each of the circuit cells 16 will be an active circuit cell or an inactive circuit cell based on its performance. FIG. 4 is a top view of a wafer field map 50 including a representation of a wafer 52 having a number of cell sites 54, where each site 54 represents one of the circuit cells 16. Some of the sites 54 are designated as active are shaded as sites 56 and those sites 54 that are designated as inactive are shaded as sites 58.

An automated process that employs a wafer-to-wafer pairing algorithm of primary and mirrored wafers looks at the wafer map 50 at box 40 to identify the locations of the active circuit cells 16 and the inactive circuit cells 16 on the wafers. The process selects the optimal pairing of any two particular primary and mirrored wafers so that when those wafers are aligned and bonded with each other, where two circuit cells 16 will oppose each other, the largest number of opposing circuit cell pairs that include at least one active circuit cell is obtained, thus optimizing the yield of the fabrication process. It is also possible that the pairing process of a circuit cell pair may be performed at the diced die level as opposed to the entire wafer-to-wafer level.

For any given pair of primary and mirrored wafers, there are four possible circuit yield outcomes of the matching process including two active circuit cells, a top active circuit cell and a bottom inactive circuit cell, a top inactive circuit cell and a bottom active circuit cell, and two inactive circuit cells, resulting in three outcomes that should result in at least one properly operating circuit. The wafer-to-wafer pairing algorithm attempts to minimize the number of outcomes that occur for two inactive circuit cells for a given bonded wafer pair, but if they all cannot be avoided, then the algorithm chooses the better performing of the two circuit cells as being an active circuit cell. For those circuit cell pairs that include two active integrated circuit cells, the pairing algorithm will also select the better performing of the cells as the active cell for that pair, and the other previously designated active cell is made an inactive cell for the final circuit package. The algorithm can make that determination based on any suitable criteria, such as which cell may have better electrical performance data, even though the performance data for both cells was determined to be good.

Once a particular circuit cell in a pair of opposing circuit cells is designated as being the active circuit cell and the other as being the inactive circuit cell, where the better performing of the two circuit cells was chosen as the active cell, the process then exposes the active circuit cell to a mini-active mask plate through a suitable photolithographic and metallic deposition method to form the desired electrical connections and make the circuit cell operable, and conversely exposes the inactive circuit cell to a mini-inactive mask plate to make that circuit cell inoperable at box 42. In other words, the mini-active plate is used to pattern the proper electrical connections in the active circuit cell to the RF I/O and DC body lines, while the mini-inactive plate exposes a blanket ground metal plane on the inactive circuit, except where vertical DC and RF I/O connections are provided to/from the opposing wafer circuit bonded to it, effectively becoming a shorting ground plane. The mask plates discussed herein are identified as "mini" because they only cover the particular circuit cell 16 being exposed while it is still part of the wafer. The active circuit cell is specifically designed to operate in a low cavity height environment so that the blanketed inactive circuit cell becomes its top ground cover. Vertical connections to and from the opposing wafers are achieved through a combination of backside vias and inter-cavity inter-connects (ICICs). In a similar manner, the top ground cover can be strapped to the active circuit's coplanar and/or backside ground plane as needed.

Figure 5:
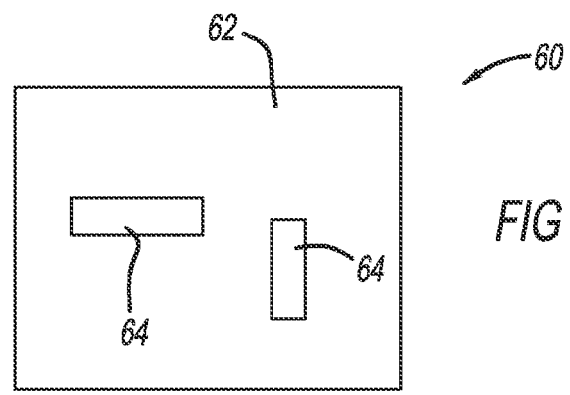
FIG. 5 is a top view of a mini-active mask plate.

FIG. 5 is a top view of a mini-active mask plate 60 used to expose the electrical connection lines needed to render a particular circuit cell 16 of a given wafer map 50 an active circuit cell. The mini-active plate 60 includes a clear substrate 62, such as glass, with opaque regions 64. When the active circuit cell 16 is exposed and processed through a suitable photolithography method using the mini-active plate 60, and subsequently processed through a suitable metal deposition process, the electrical connections between the component 18 and the ports 20 and 22 are formed.

Figure 6:
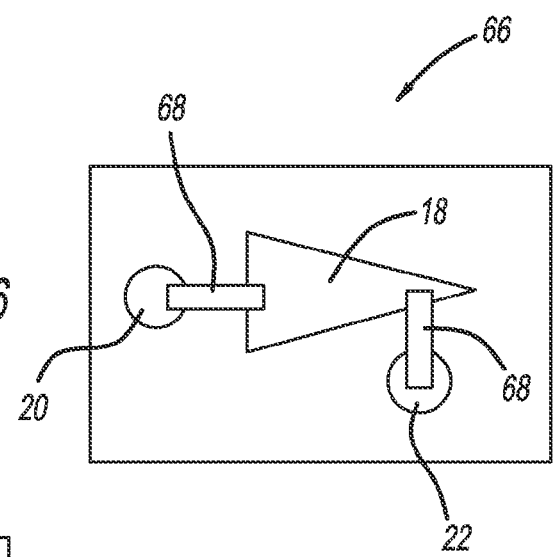
FIG. 6 is a top view of one of the active circuit cells exposed to the active plate.

FIG. 6 is a top view of a circuit cell 66 similar to the circuit cell 16, where like elements are identified by the same reference number, showing electrical connections 68, formed after the aforementioned photolithographic and metal deposition processing with the mini-active plate 60, that connect the component 18 to the input/output port 20 and the component 18 to the DC bias port 22.

Figure 7:
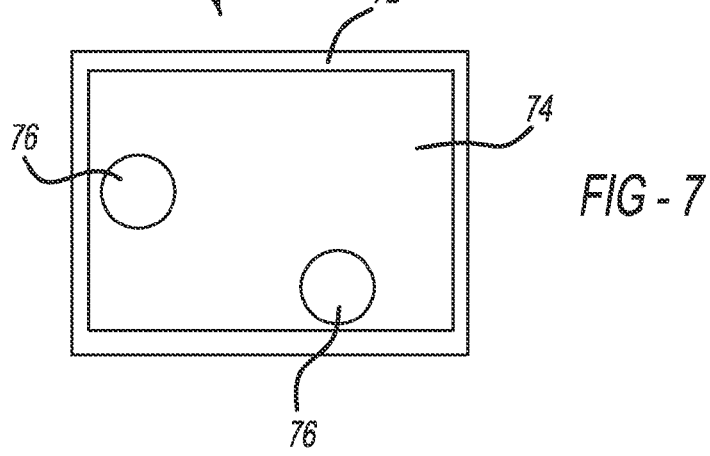
FIG. 7 is a top view of a mini-inactive mask plate.

FIG. 7 is a top view of a mini-inactive mask plate 70 used to expose the inactive circuit cells 16 identified by the wafer map 50 to render the inactive cell inoperable. The mini-inactive plate 70 includes a clear substrate 72, such as glass, with an opaque region 74 that covers most of the plate 70 except for input/output and DC bias cutout regions 76. When the inactive circuit cell 16 is exposed and processed by a suitable photolithography method using the mini-active plate 70, and subsequently processed through a suitable metal deposition process, a metal layer covers the entire inactive circuit, effectively short circuiting the circuit to ground, except for the input port 20 and the DC bias port 22, which will be used as electrical connections through the wafer level package, as will become more apparent from the discussion below.

Figure 8:
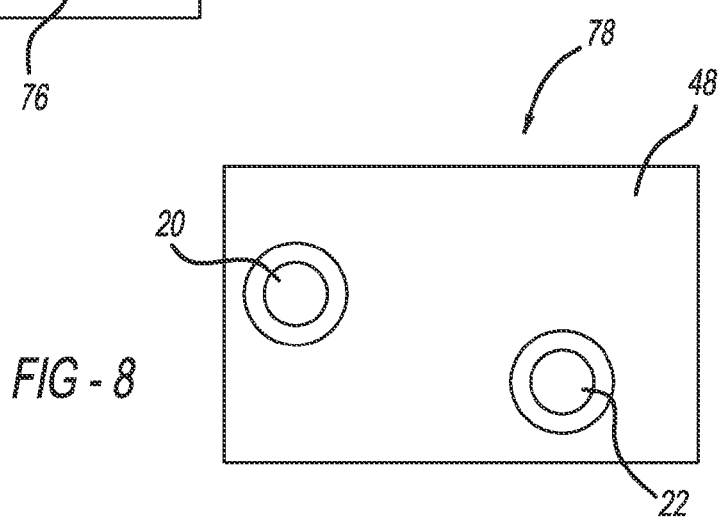
FIG. 8 is a top view of an inactive circuit cell exposed to the inactive plate.

FIG. 8 is a top view of an inactive circuit cell 78, formed after aforementioned photolithographic and metal deposition processing with the mini-active plate, including a metal layer 48 that covers the entire circuit, except for the ports 20 and 22.

Once each of the circuit cells 16 is exposed to the mini-active plate 60 or the min-inactive plate 70, each of the wafers is subjected to backside and three-dimensional processing at box 44 to provide the various backside metal layers, ground planes, ICICs, backside substrate vias, etc. After all of the pre-wafer three-dimensional processing has been performed, the two previously matched wafers from box 40 are then bonded together at box 46 by any suitable wafer bonding fabrication techniques, many of which are well known to those skilled in the art.

Figure 9:
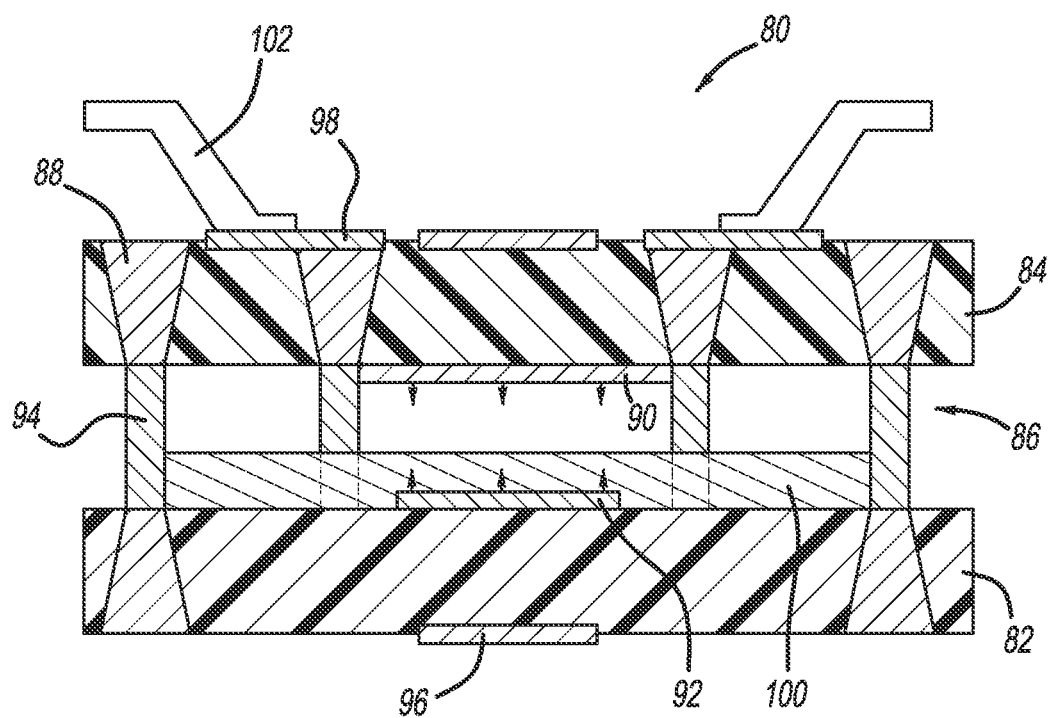
FIG. 9 is a cross-sectional profile view of a WLP integrated circuit package including an upper active circuit and a lower inactive circuit.

FIG. 9 is a cross-sectional profile view of a wafer level packaged circuit 80 that has been singulated by a suitable scribe and dice or sawing technique from two-bonded wafers, as discussed above, where one of the wafers is designated a primary wafer 82 and the other wafer is designated a secondary wafer 84, and defining a precisely formed gap 86, known as the cavity height, therebetween. Each of the wafers 82 and 84 includes several metalized backside vias 88 that provide signal and ground connections through the particular wafer 82 or 84. An active circuit 90 has been defined on the secondary wafer 84 and an inactive circuit 92 has been defined on the primary wafer 82 by the process discussed above. A plurality of ICICs 94 extend across the cavity 86 and provide an electrical connection to the metalized vias 88 in the wafers 82 and 84, as shown. A backside metal layer 96 is provided on a surface of the primary wafer 82 and a surface of the secondary wafer 84 opposite to the cavity 86, and electrical contacts 98 are provided on a surface of the secondary wafer 84 opposite to the cavity 86. RF/DC probes 102 are electrically coupled to the electrical contacts 98 and certain ones of the vias 88 and the ICICs 94, as shown. Because the inactive circuit 92 has been exposed through the mini-inactive plate 70, a metal blanket layer 100 is deposited over the inactive circuit 92 except for the port regions discussed above, as designated with dashed lines in FIG. 9. In this particular design, the outside ICICs 94 are ground connections that are electrically coupled to the metal layer 100 and the inside ICICs 94 are electrically coupled to the RF/DC probes 102 and are electrically isolated from the metal layer 100 as a result of the cutout regions 76 in the mini-inactive plate 70.

Figure 10:
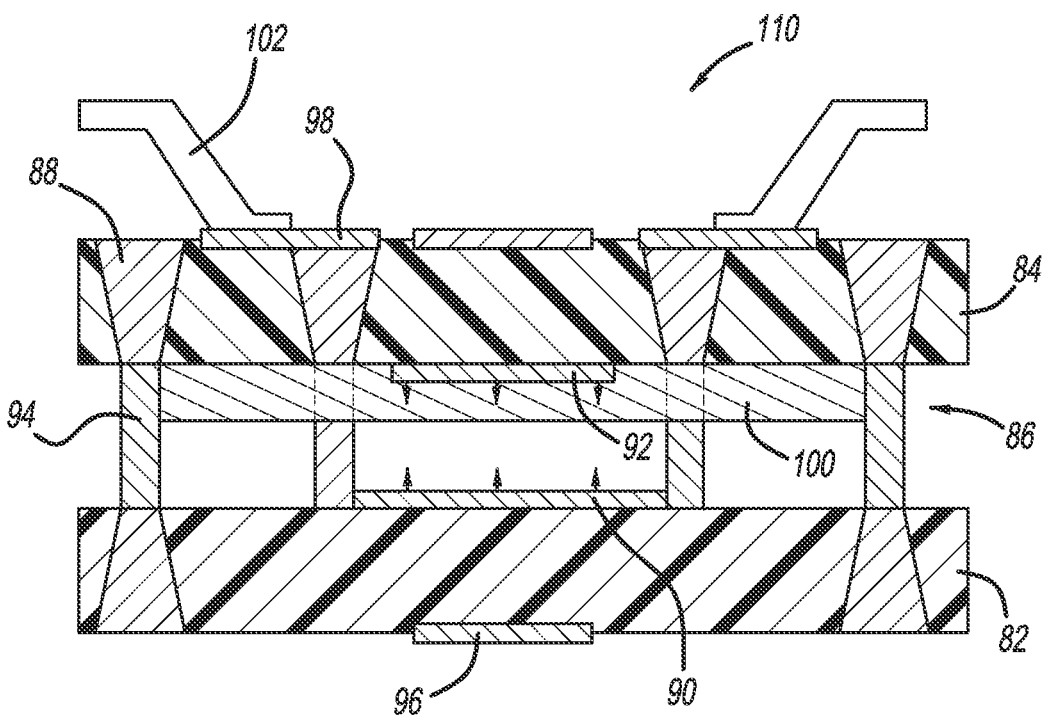
FIG. 10 is a cross-sectional profile view of a WLP integrated circuit package including an upper inactive circuit and a lower active circuit.

FIG. 10 is a cross-sectional profile view of a wafer level package 110 similar to the package 80, where like elements are identified by the same reference number. In the package 110, the inactive circuit 92 is provided on the secondary wafer 84 and the active circuit 90 is provided on the primary wafer 82. It is noted that although the packages 80 and 110 are a two-layer circuit system, the vertical redundancy technique of the present invention may be extended to any wafer pairs in an N-layer system, where N≥2.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A wafer level package comprising:
a first wafer substrate including a first surface and a second surface;
a second wafer substrate including a first surface and a second surface, said first wafer substrate being bonded to the second wafer substrate and defining a cavity therebetween;
at least one intercavity interconnect (ICIC) extending across the cavity and being electrically coupled to at least one via extending through the first wafer substrate or the second wafer substrate;
a first integrated circuit fabricated on the second surface of the first substrate and positioned within the cavity;
a second integrated circuit fabricated on the first surface of the second substrate and positioned within the cavity where one of the first and second integrated circuits is designated as an active circuit and the other of the first and second integrated circuits is designated as an inactive circuit; and
a metal blanket layer deposited over the inactive circuit so as to make the inactive circuit inoperable.

2. The package according to claim 1 wherein the first and second integrated circuits are redundant and mirrored circuits and include the same circuit components.

3. The package according to claim 1 wherein the metal blanket layer includes at least one opening through which the at least one ICIC extends to be electrically isolated from the metal layer.

4. The package according to claim 3 wherein the at least one ICIC is electrically coupled to an RF or DC electrical contact formed on the first surface of the first wafer substrate by a via extending through the first wafer substrate.

5. The package according to claim 1 wherein the at least one ICIC is electrically coupled to the metal blanket layer.

6. The package according to claim 1 wherein the at least one ICIC is a plurality of ICICs where at least one of the plurality of ICICs extends through an opening in the metal blanket layer and at least one of the plurality of ICICs is electrically coupled to the metal blanket layer.

7. The package according to claim 1 wherein the first and second integrated circuits are designated as the active circuit or the inactive circuit based on a performance test of the integrated circuit.

8. The package according to claim 7 wherein the performance test includes providing DC and RF measurements of the integrated circuit.

9. A wafer level package comprising:
a first wafer substrate including a first surface and a second surface;
a second wafer substrate including a first surface and a second surface, said first wafer substrate being bonded to the second wafer substrate and defining a cavity therebetween;
a first integrated circuit fabricated on the second surface of the first substrate and positioned within the cavity;
a second integrated circuit fabricated on the first surface of the second substrate and positioned within the cavity where one of the first and second integrated circuits is designated as an active circuit and the other of the first and second integrated circuits is designated as an inactive circuit, wherein the first and second integrated circuits are redundant circuits and include the same circuit components; and
a metal blanket layer deposited over the inactive circuit so as to make the inactive circuit inoperable.

10. The package according to claim 9 further comprising a plurality of intercavity interconnects (ICICs) where at least one of the plurality of ICICs extends through an opening in the metal blanket layer and at least one of the plurality of ICICs is electrically coupled to the metal blanket layer.

11. The package according to claim 9 wherein the first and second integrated circuits are designated as the active circuit or the inactive circuit based on a performance test of the integrated circuit.

12. A method for fabricating a three-dimensional wafer level package including vertically redundant integrated circuits, said method comprising:
providing a plurality of wafer substrates;
fabricating a plurality of integrated circuits on each of the wafer substrates;
testing a performance of each of the integrated circuits on all of the wafer substrates;
generating a wafer map for each of the wafer substrates based on the performance test for each of the integrated circuits on each wafer substrate that identifies each circuit as being an operable active circuit or an inoperable inactive circuit based on its performance;
pairing two or more wafer substrates together based on their respective wafer maps to optimize a yield of pairs of vertically opposed circuits where an optimized number of pairs of integrated circuits includes at least one active circuit;
processing each integrated circuit on each wafer based on the wafer-to-wafer pairing so that the active circuits include active circuit connections and the inactive circuits include a metallization layer that short circuits components in the inactive circuit; and
providing wafer-to-wafer bonding of the wafer substrates that have been paired together so that vertically opposed active and inactive integrated circuits are positioned within a cavity between the wafer substrates.

13. The method according to claim 12 wherein testing the performance of the integrated circuits includes performing one or more of in-circuit measurements of DC and/or RF characteristics, DC and/or RF measurements of strategically placed probeable sample devices, or combinations thereof.

14. The method according to claim 12 wherein pairing two or more wafer substrates includes minimizing the number of inactive circuit pairs.

15. The method according to claim 12 wherein processing each integrated circuit includes exposing each active circuit to an active mask plate to generate the circuit connections and exposing each inactive circuit to an inactive mask plate to provide the metallization layer.

16. The method according to claim 15 wherein the inactive mask plate includes cut-out regions that prevent one or more ports in the inactive circuit from being metalized by the metal layer.

17. The method according to claim 16 wherein processing each integrated circuit includes electrically coupling the ports in the inactive cell to an intercavity interconnect (ICIC) extending across the cavity.

18. The method according to claim 15 wherein the active plate and the inactive plate are about the same size of the integrated circuit.

19. The method according to claim 12 further comprising providing backside and three-dimensional wafer fabrication processes for the plurality of wafer substrates prior to providing wafer-to-wafer bonding.

* * * * *